US012146778B2

(12) United States Patent
Eiland et al.

(10) Patent No.: US 12,146,778 B2
(45) Date of Patent: Nov. 19, 2024

(54) SYSTEMS AND METHODS FOR ESTIMATING FLOW RATE IN A LIQUID COOLING SYSTEM

(71) Applicant: Dell Products L.P., Round Rock, TX (US)

(72) Inventors: Richard M. Eiland, Austin, TX (US); Robert B. Curtis, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 328 days.

(21) Appl. No.: 17/871,653

(22) Filed: Jul. 22, 2022

(65) Prior Publication Data

US 2024/0027247 A1 Jan. 25, 2024

(51) Int. Cl.
*G01F 1/696* (2006.01)
*G01F 1/56* (2006.01)
*G06F 1/20* (2006.01)
*H05K 7/20* (2006.01)

(52) U.S. Cl.
CPC ............... *G01F 1/696* (2013.01); *G01F 1/56* (2013.01); *G06F 1/20* (2013.01); *H05K 7/20281* (2013.01)

(58) Field of Classification Search
CPC .. G01F 1/56; G01F 1/696; G06F 1/20; H05K 7/20281
See application file for complete search history.

(56) References Cited

U.S. PATENT DOCUMENTS 9,671,840 B2 * 6/2017 Haridass ................. G06F 1/206
10,506,743 B2 * 12/2019 Lovicott ............ H05K 7/20727
2023/0417602 A1 12/2023 Curtis et al.

* cited by examiner

*Primary Examiner* — An H Do
(74) *Attorney, Agent, or Firm* — Jackson Walker L.L.P.

(57) ABSTRACT

A method may include receiving power information from an information handling resource regarding an amount of electrical power consumed by the information handling resource, receiving first temperature information from a first temperature sensor regarding a first temperature, receiving second temperature information from the second temperature sensor regarding a second temperature, and based on the power information, the first temperature information, and the second temperature information, estimating a fluid flow rate of the liquid coolant through the liquid cooling system.

24 Claims, 1 Drawing Sheet

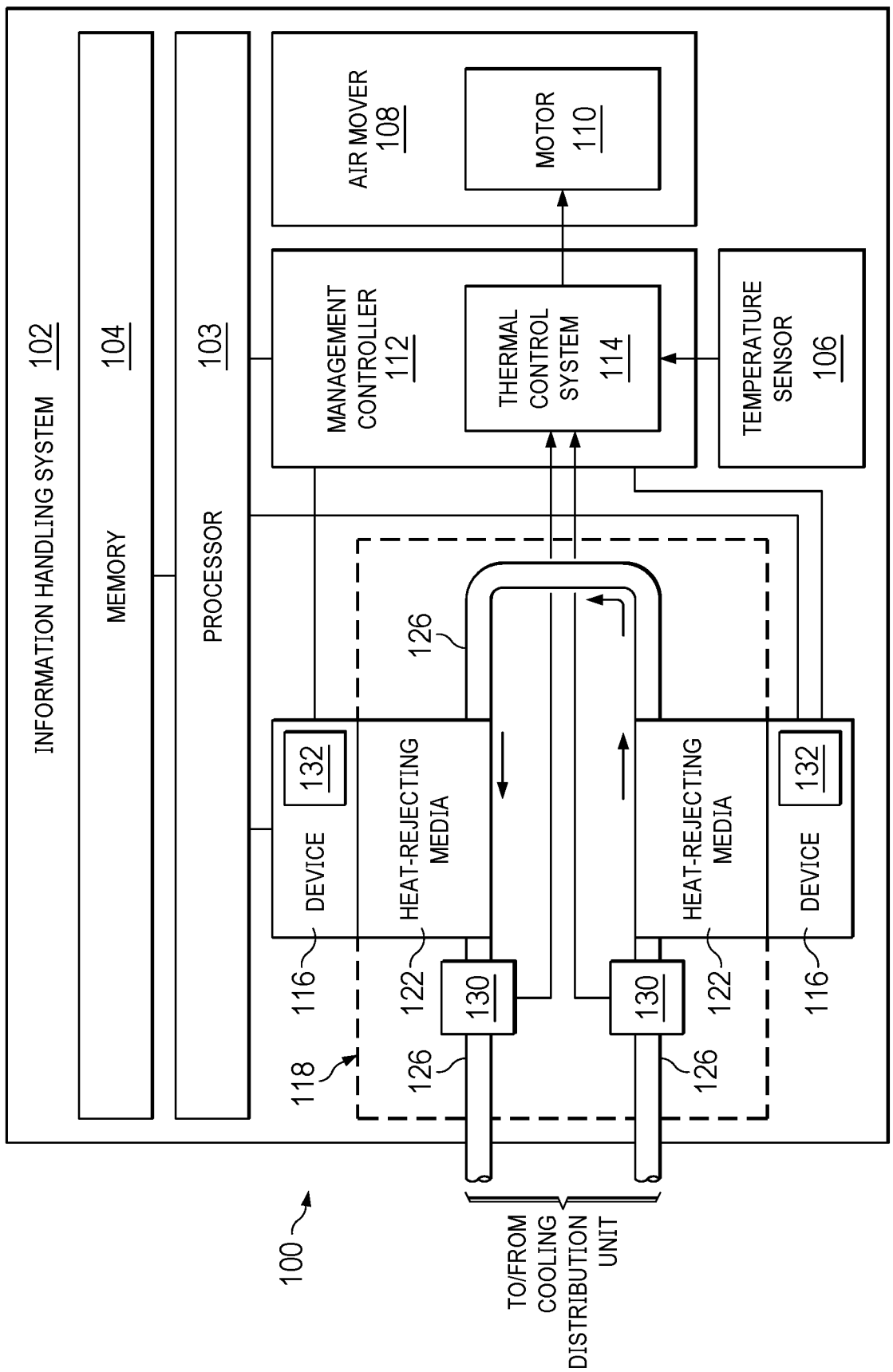

SYSTEMS AND METHODS FOR ESTIMATING FLOW RATE IN A LIQUID COOLING SYSTEM

TECHNICAL FIELD

The present disclosure relates in general to information handling systems, and more particularly to estimation of liquid coolant flow rates in liquid-cooled information handling systems based on measurement parameters other than liquid coolant flow rate.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

Existing liquid cooling cold plate assemblies and loops have no means for directly measuring the rate of flow of coolant fluid entering or exiting a liquid cooling system. If known, node-level fluid flow rates could be used to provide the user or system management controller with information about health status of the liquid system, including any issues with flow rate or leaks, or assist in balancing flow amongst a larger rack-level manifold/fluid system.

SUMMARY

In accordance with the teachings of the present disclosure, the disadvantages and problems associated with determining fluid flow rates in liquid cooling systems may be substantially reduced or eliminated.

In accordance with embodiments of the present disclosure, an information handling system may include an information handling resource, a liquid cooling system thermally coupled to the information handling resource and configured to cool the information handling resource via transfer of heat from the information handling resource to liquid coolant flowing in the liquid cooling system, a first temperature sensor configured to measure a first temperature within the information handling system, a second temperature sensor configured to measure a second temperature within the information handling system, and a controller communicatively coupled to the information handling resource. The controller may be configured to receive power information from the information handling resource regarding an amount of electrical power consumed by the information handling resource, receive first temperature information from the first temperature sensor regarding the first temperature, receive second temperature information from the second temperature sensor regarding the second temperature, and based on the power information, the first temperature information, and the second temperature information, estimate a fluid flow rate of the liquid coolant through the liquid cooling system.

In accordance with these and other embodiments of the present disclosure, a method may include receiving power information from an information handling resource regarding an amount of electrical power consumed by the information handling resource, receiving first temperature information from a first temperature sensor regarding a first temperature, receiving second temperature information from the second temperature sensor regarding a second temperature, and based on the power information, the first temperature information, and the second temperature information, estimating a fluid flow rate of the liquid coolant through the liquid cooling system.

In accordance with these and other embodiments of the present disclosure, an article of manufacture may include a non-transitory computer-readable medium and computer-executable instructions carried on the computer-readable medium, the instructions readable by a processing device, the instructions, when read and executed, for causing the processing device to: receive power information from an information handling resource regarding an amount of electrical power consumed by the information handling resource, receive first temperature information from a first temperature sensor regarding a first temperature, receive second temperature information from the second temperature sensor regarding a second temperature, and based on the power information, the first temperature information, and the second temperature information, estimate a fluid flow rate of the liquid coolant through the liquid cooling system.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawing, in which like reference numbers indicate like features, and wherein:

THE FIGURE illustrates a block diagram of selected components of an example information handling system, in accordance with embodiments of the present disclosure.

DETAILED DESCRIPTION

Preferred embodiments and their advantages are best understood by reference to THE FIGURE, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

THE FIGURE illustrates a block diagram of selected components of an example information handling system 102, in accordance with embodiments of the present disclosure. In some embodiments, information handling system 102 may comprise a server or "blade." In other embodiments, information handling system 102 may comprise a personal computer (e.g., a desktop computer, laptop computer, mobile computer, and/or notebook computer). In yet other embodiments, information handling system 102 may comprise a storage device configured to house a plurality of physical disk drives and/or other computer-readable media for storing data. As shown in THE FIGURE, information handling system 102 may include a chassis 100 or other enclosure housing a processor 103, a memory 104, a temperature sensor 106, an air mover 108, a management controller 112, one or more devices 116, and a liquid cooling system 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal communicated from thermal control system 114 of management controller 112. In operation, air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102, for example via a management console communicatively coupled to management controller 112. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller.

As shown in THE FIGURE, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirement information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

A device 116 may comprise any component information handling system of information handling system 102, including without limitation processors, buses, memories, I/O devices and/or interfaces, storage resources, network interfaces, motherboards, integrated circuit packages, electro-mechanical devices, displays, and power supplies.

As shown in THE FIGURE, a device 116 may have integrated therein a device temperature sensor 132. A device temperature sensor 132 may be any system, device, or apparatus (e.g., a thermometer, thermistor, etc.) configured to communicate a signal (e.g., to management controller 112) indicative of a temperature within and/or proximate to temperature sensor 132.

Oftentimes, an architecture of information handling system 102 may be such that device 116 may not be adequately cooled by air mover 108, and thus liquid cooling system 118 may provide cooling of device 116 in addition to or in lieu of air mover 108. As shown in THE FIGURE, liquid cooling system 118 may include heat-rejecting media 122, one or more coolant temperature sensors 130, and fluidic conduits 126.

In normal operation, a pump (which is not explicitly shown, may be external to information handling system 102, and further may be located within a centralized fluid cooling and distribution system) may induce a flow of liquid (e.g., water, ethylene glycol, propylene glycol, or other coolant) through various fluidic conduits 126 and heat-rejecting media 122 of information handling system 102. As fluid passes through heat-rejecting media 122, heat may be transferred from device 116 to heat-rejecting media 122 and from heat-rejecting media 122 to the liquid coolant. Such heated coolant may flow to a radiator (which is not explicitly shown, may be external to information handling system 102, and further may be located within a centralized fluid cooling and distribution system), and heat from the coolant may be transferred from the coolant to air ambient to such radiator (or in some instances, from the coolant to another liquid if implemented as a liquid-to-liquid radiator), thus cooling the fluid.

Heat-rejecting media 122 may include any system, device, or apparatus configured to transfer heat from an information handling resource (e.g., device 116, as shown in THE FIGURE), thus reducing a temperature of the information handling resource. For example, heat-rejecting media 122 may include a solid thermally coupled to the information handling resource (e.g., heat pipe, heat spreader, heatsink, finstack, etc.) such that heat generated by the information handling resource is transferred from the information handling resource.

As shown in THE FIGURE, liquid cooling system 118 may also include a plurality of coolant temperature sensors 130 within the fluid flow path of liquid cooling system 118. A coolant temperature sensor 130 may comprise any suitable system, device, or apparatus configured to measure a temperature of liquid coolant proximate to such coolant temperature sensor 130, and communicate an electrical or electronic signal (e.g., to management controller 112/thermal control system 114) indicative of such measured temperature. As an example, in some embodiments, one or more of coolant temperature sensors 130 may be integrated within a fluidic conduit 126 or a fluid fitting of liquid cooling system 118, as described in U.S. patent application Ser. No. 17/850,076, filed Jun. 27, 2022, and incorporated by reference herein in its entirety.

As depicted in THE FIGURE, one of coolant temperature sensors 130 may measure an inlet temperature of coolant fluid into liquid cooling system 118 and another one of coolant temperature sensors 130 may measure an outlet temperature of coolant fluid from liquid cooling system 118, such that the difference between the inlet temperature and the outlet temperature represents an increase in temperature of the coolant fluid caused by transfer of heat from heat-rejecting media 122 to the coolant fluid, and thus may be indicative of the heat dissipated from heat-rejecting media 122 to the coolant fluid.

In addition to processor 103, memory 104, temperature sensor 106, air mover 108, management controller 112, devices 116, and liquid cooling system 118, information handling system 102 may include one or more other information handling resources. In addition, for the sake of clarity and exposition of the present disclosure, THE FIGURE depicts only one air mover 108 and two devices 116. In embodiments of the present disclosure, information handling system 102 may include any number of air movers 108 and devices 116. Furthermore, for the sake of clarity and exposition of the present disclosure, THE FIGURE depicts devices 116 and a liquid cooling system 118 for cooling of devices 116. However, in some embodiments, approaches similar or identical to those used to actively cool devices 116 as described herein may be employed to provide active cooling of processor 103, memory 104, management controller 112, and/or any other information handling resource of information handling system 102.

In operation, based on telemetry regarding temperature information reported to management controller 112 from coolant temperature sensors 130 and power consumption information reported to management controller 112 from devices 116, management controller 112 may be configured to estimate a coolant flow rate through liquid cooling system 118 based on principles of energy balance, as described in greater detail below.

Loop Virtual Energy Balance

In some embodiments, management controller 112 may in essence virtually detect a flow rate of coolant fluid through liquid cooling system 118 by applying an energy balance equation to power consumption information reported to management controller 112 from devices 116 and to the temperatures measured by coolant temperature sensors 130. For example, management controller 112 may estimate a fluid flow rate $\dot{m}$ (e.g., in terms of fluid mass per unit time) as:

$$\dot{m} = \frac{Q}{C_p(T_{OUT} - T_{IN})}$$

wherein Q is the sum of power consumed by devices 116, $T_{IN}$ is an inlet temperature of coolant fluid received by liquid cooling system 118 as measured by a coolant temperature sensor 130, $T_{OUT}$ is an outlet temperature of coolant fluid returned by liquid cooling system 118 as measured by a coolant temperature sensor 130, and $C_P$ is a known or otherwise derivable property of the cooling fluid.

Loop Characterized Energy Balance

In a loop characterized energy balance approach, during characterization (e.g., laboratory testing prior to delivery to an intended end user) of information handling system 102 or an information handling system with an identical or similar configuration to that of information handling system 102, the system under test may be operated at differing levels of power consumption by devices 116 and/or driven by different levels of fluid flow rate through liquid cooling system 118. In response to these differing stimuli, power consumed by devices 116, temperature sensed by coolant temperature sensors 130, and measured flow rate of coolant fluid through liquid cooling system 118 (e.g., by a flow rate sensor available during characterization that is not feasible to include within information handling system 102 as delivered to an end user), the characterization tool may determine an empirical correlation between flow rate on one hand, and power consumption and temperature difference on the other hand. For instance, the characterization tool may determine coefficients of an equation for estimating fluid flow rate as a function of power consumption and a difference between inlet and outlet temperatures. An example of such an equation is:

$$\dot{V} = a_0 + a_1 Q + b_1 \Delta T + a_2 Q^2 + b_1 (\Delta T)^2 + \ldots + a_n Q^n + b_n (\Delta T)^n$$

wherein $\dot{V}$ is a fluid flow rate in terms of fluid volume per unit time, $\Delta T = T_{OUT} - T_{IN}$, coefficients $a_0 \ldots a_n$ and $b_1 \ldots b_n$ are coefficients determined by the mathematical correlation performed by the characterization tool, and n represents a polynomial order for the equation, wherein n may be any suitable number 1 or greater, depending on the desired complexity and precision of the flow rate estimation. Prior to delivery for end user, such coefficients $a_0 \ldots a_n$ and $b_1 \ldots b_n$ may be stored within a thermal table or other data structure in computer-readable media integral to or otherwise accessible to management controller 112.

During end-use operation, management controller 112 may estimate a flow rate of coolant fluid through liquid cooling system 118 by applying the foregoing equation for flow rate $\dot{m}$ to power consumption information reported to management controller 112 from devices 116 and to the temperatures measured by coolant temperature sensors 130.

Although the foregoing equation for volumetric flow rate is given in terms of a polynomial, it is understood that other types of equations may be used, including without limitation exponential, power, and/or logarithmic relationships between volumetric flow rate on one hand and power consumption and/or temperature on the other hand.

Thermal Resistance Characterized Flow Rate

In a thermal resistance characterized flow rate approach, during characterization (e.g., laboratory testing prior to delivery to an intended end user) of information handling system 102 or an information handling system with an identical or similar configuration to that of information handling system 102, the system under test may be operated at differing levels of power consumption by devices 116 and/or driven by different levels of fluid flow rate through liquid cooling system 118. In response to these differing stimuli, power consumed by devices 116, temperature sensed by a coolant temperature sensor 130, temperature sensed by a device temperature sensor 132, and a measured flow rate of coolant fluid through liquid cooling system 118 (e.g., by a flow rate sensor available during characterization that is not feasible to include within information handling system 102 as delivered to an end user), the characterization tool may determine an empirical correlation between flow rate on one hand and thermal resistance on the other hand. For instance, the characterization tool may determine coefficients of an equation for estimating fluid flow rate as a function of power consumption and a difference between inlet and outlet temperatures. An example of such an equation is:

$$\dot{V} = c + c_1 \theta_{CA} + c_2 \theta_{CA}^2 + \ldots + c_n \theta_{CA}^n$$

wherein $\theta_{CA}$ is a thermal resistance of heat-rejecting media 122 and device 132 and coefficients $c_0 \ldots c_n$ are coefficients determined by the mathematical correlation performed by the characterization tool, and n represents a polynomial order for the equation, wherein n may be any suitable number 1 or greater, depending on the desired complexity and precision of the flow rate estimation. Thermal resistance $\theta_{CA}$ may be given by:

$$\theta_{CA} = \frac{T_{DEV} - T_{IN}}{Q}$$

wherein Q is power consumed by a device 116 closest to the coolant fluid inlet to liquid cooling system 118, $T_{IN}$ is an inlet temperature of coolant fluid received by liquid cooling system 118 as measured by a coolant temperature sensor 130 (which should be indicative of temperature of fluid delivered to heat-rejecting media 122 thermally coupled to the device 116), and $T_{DEV}$ is a device temperature of the device closest to the coolant fluid inlet as measured by coolant temperature sensor 132 of such device.

Prior to delivery for end user, such coefficients $a_0 \ldots a_n$ and $b_1 \ldots b_n$ may be stored within a thermal table or other data structure in computer-readable media integral to or otherwise accessible to management controller 112. During end-use operation, management controller 112 may estimate a flow rate of coolant fluid through liquid cooling system 118 by applying the foregoing equation for volumetric flow rate to power consumption information reported to management controller 112 from devices 116 and to the temperatures measured by coolant temperature sensors 130.

Although the foregoing equation for volumetric flow rate is given in terms of a polynomial, it is understood that other types of equations may be used, including without limitation exponential, power, and/or logarithmic relationships between volumetric flow rate and thermal resistance.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
    an information handling resource;
    a liquid cooling system thermally coupled to the information handling resource and configured to cool the information handling resource via transfer of heat from the information handling resource to liquid coolant flowing in the liquid cooling system;
    a first temperature sensor configured to measure a first temperature within the information handling system;
    a second temperature sensor configured to measure a second temperature within the information handling system; and
    a controller communicatively coupled to the information handling resource and configured to:
        receive power information from the information handling resource regarding an amount of electrical power consumed by the information handling resource;
        receive first temperature information from the first temperature sensor regarding the first temperature;
        receive second temperature information from the second temperature sensor regarding the second temperature; and
        based on the power information, the first temperature information, and the second temperature information, estimate a fluid flow rate of the liquid coolant through the liquid cooling system.

2. The information handling system of claim 1, wherein:
    the first temperature is a temperature of the coolant fluid at an inlet of the liquid cooling system; and
    the second temperature is a temperature of the coolant fluid at an outlet of the liquid cooling system.

3. The information handling system of claim 2, wherein the controller is configured to estimate the fluid flow rate as proportional to the amount of electrical power consumed divided by a difference between the second temperature and the first temperature.

4. The information handling system of claim 3, wherein a proportionality constant between the fluid flow rate and the amount of electrical power consumed divided by a difference between the second temperature and the first temperature is known.

5. The information handling system of claim 2, wherein the controller is configured to estimate the fluid flow rate as equal to a mathematical function of the amount of electrical power consumed and a difference between the second temperature and the first temperature.

6. The information handling system of claim 5, wherein coefficients of the mathematical function are determined by characterization of the liquid cooling system that correlates measured flow rates performed during the characterization to measurements of the electrical power consumed and measurements of the difference between the second temperature and the first temperature performed during the characterization.

7. The information handling system of claim 1, wherein:
the first temperature is a temperature of the coolant fluid at an inlet of heat-rejecting media thermally coupled to the information handling resource; and
the second temperature is a temperature of the information handling resource.

8. The information handling system of claim 7, wherein the controller is further configured to:
estimate a thermal resistance of the heat-rejecting media and the information handling resource as proportional to a difference between the second temperature and the first temperature and the amount of electrical power consumed; and
estimate the fluid flow rate as equal to a mathematical function of the thermal resistance.

9. A method comprising:
receiving power information from an information handling resource regarding an amount of electrical power consumed by the information handling resource;
receiving first temperature information from a first temperature sensor regarding a first temperature;
receiving second temperature information from the second temperature sensor regarding a second temperature; and
based on the power information, the first temperature information, and the second temperature information, estimating a fluid flow rate of the liquid coolant through the liquid cooling system.

10. The method of claim 9, wherein:
the first temperature is a temperature of the coolant fluid at an inlet of the liquid cooling system; and
the second temperature is a temperature of the coolant fluid at an outlet of the liquid cooling system.

11. The method of claim 10, further comprising estimating the fluid flow rate as proportional to the amount of electrical power consumed divided by a difference between the second temperature and the first temperature.

12. The method of claim 11, wherein a proportionality constant between the fluid flow rate and the amount of electrical power consumed divided by a difference between the second temperature and the first temperature is known.

13. The method of claim 10, further comprising estimating the fluid flow rate as equal to a mathematical function of the amount of electrical power consumed and a difference between the second temperature and the first temperature.

14. The method of claim 13, wherein coefficients of the mathematical function are determined by characterization of the liquid cooling system that correlates measured flow rates performed during the characterization to measurements of the electrical power consumed and measurements of the difference between the second temperature and the first temperature performed during the characterization.

15. The method of claim 9, wherein:
the first temperature is a temperature of the coolant fluid at an inlet of heat-rejecting media thermally coupled to the information handling resource; and
the second temperature is a temperature of the information handling resource.

16. The method of claim 15, further comprising:
estimating a thermal resistance of the heat-rejecting media and the information handling resource as proportional to a difference between the second temperature and the first temperature and the amount of electrical power consumed; and
estimating the fluid flow rate as equal to a mathematical function of the thermal resistance.

17. An article of manufacture comprising:
a non-transitory computer-readable medium; and
computer-executable instructions carried on the computer-readable medium, the instructions readable by a processing device, the instructions, when read and executed, for causing the processing device to:
receive power information from an information handling resource regarding an amount of electrical power consumed by the information handling resource;
receive first temperature information from a first temperature sensor regarding a first temperature;
receive second temperature information from the second temperature sensor regarding a second temperature; and
based on the power information, the first temperature information, and the second temperature information, estimate a fluid flow rate of the liquid coolant through the liquid cooling system.

18. The article of claim 17, wherein:
the first temperature is a temperature of the coolant fluid at an inlet of the liquid cooling system; and
the second temperature is a temperature of the coolant fluid at an outlet of the liquid cooling system.

19. The article of claim 18, the instructions for further causing the processing device to estimate the fluid flow rate as proportional to the amount of electrical power consumed divided by a difference between the second temperature and the first temperature.

20. The article of claim 19, wherein a proportionality constant between the fluid flow rate and the amount of electrical power consumed divided by a difference between the second temperature and the first temperature is known.

21. The article of claim 18, the instructions for further causing the processing device to estimate the fluid flow rate as equal to a mathematical function of the amount of electrical power consumed and a difference between the second temperature and the first temperature.

22. The article of claim 21, wherein coefficients of the mathematical function are determined by characterization of the liquid cooling system that correlates measured flow rates performed during the characterization to measurements of the electrical power consumed and measurements of the difference between the second temperature and the first temperature performed during the characterization.

23. The article of claim 17, wherein:
the first temperature is a temperature of the coolant fluid at an inlet of heat-rejecting media thermally coupled to the information handling resource; and
the second temperature is a temperature of the information handling resource.

24. The article of claim 23, the instructions for further causing the processing device to:
estimate a thermal resistance of the heat-rejecting media and the information handling resource as proportional to a difference between the second temperature and the first temperature and the amount of electrical power consumed; and
estimate the fluid flow rate as equal to a mathematical function of the thermal resistance.

* * * * *